(12) United States Patent
Dietz

(10) Patent No.: US 8,770,107 B2
(45) Date of Patent: Jul. 8, 2014

(54) DEVICE AND METHOD FOR PRODUCING FLEXOGRAPHIC PRINTING SLEEVES

(75) Inventor: Gernot Dietz, Eisenberg (DE)

(73) Assignee: Fling Group Germany GmbH, Stuttgart (DE)

( * ) Notice: Subject to any disclaimer, the term of this patent is extended or adjusted under 35 U.S.C. 154(b) by 0 days.

(21) Appl. No.: 13/698,080

(22) PCT Filed: May 16, 2011

(86) PCT No.: PCT/EP2011/057833
§ 371 (c)(1),
(2), (4) Date: Dec. 26, 2012

(87) PCT Pub. No.: WO2011/144553
PCT Pub. Date: Nov. 24, 2011

(65) Prior Publication Data
US 2013/0095432 A1 Apr. 18, 2013

(30) Foreign Application Priority Data
May 17, 2010 (DE) .................. 10 2010 029 018

(51) Int. Cl.
*B65G 49/02* (2006.01)
(52) U.S. Cl.
CPC ..................................... *B65G 49/02* (2013.01)
USPC ...................................................... 101/401.1

(58) Field of Classification Search
CPC ............................. G03F 7/3064; G03F 7/3065
USPC ............ 216/8, 10; 101/479, 480; 414/331.11, 414/331.17; 198/465.2, 468.01, 468.9
See application file for complete search history.

(56) References Cited

U.S. PATENT DOCUMENTS

| | | | |
|---|---|---|---|
| 4,104,104 A * | 8/1978 | Anderson | ................ 156/345.15 |
| 4,108,683 A | 8/1978 | Anderson | |
| 5,275,105 A * | 1/1994 | Schweizer et al. | ............ 101/477 |
| 5,919,378 A | 7/1999 | Ferrante | |
| 7,117,793 B2 * | 10/2006 | Petersen et al. | ................ 101/477 |

OTHER PUBLICATIONS

International Search Report for PCT/EP2011/057833 mailed Aug. 26, 2011.

* cited by examiner

*Primary Examiner* — Ren Yan
*Assistant Examiner* — Justin Olamit
(74) *Attorney, Agent, or Firm* — Drinker Biddle & Reath LLP

(57) ABSTRACT

Device for producing flexographic printing sleeves starting from photopolymerizable sleeves comprising at least a clean-out unit, a drying unit, and a post-exposure unit, wherein the flexographic printing sleeves are transported within the apparatus by means of a transport device, wherein the sleeves are mounted dually translationally in the longitudinal direction in the transport device, and a method for the production of flexographic printing sleeves using said device.

13 Claims, 8 Drawing Sheets

DEVICE AND METHOD FOR PRODUCING FLEXOGRAPHIC PRINTING SLEEVES

PRIORITY

Priority is claimed as a national stage application, under 35 U.S.C. §371, to PCT/EP2011/057833, filed May 16, 2011, which claims priority to German Application No. 10 2010 029 018.1, filed May 17, 2010. Each disclosure of the aforementioned priority applications is incorporated herein by reference in its entirety.

BACKGROUND

The invention relates to a device for producing flexographic printing sleeves starting from photopolymerizable sleeves comprising at least a clean-out unit, a drying device, and a post-exposure unit, wherein the flexographic printing sleeves are transported within the apparatus by means of a transport device, wherein the sleeves are mounted dually translationally in the longitudinal direction in the transport device. The invention further relates to a method for producing flexographic printing sleeves using this device.

The production of ready-to-print flexographic printing forms is a multi-step process. Photopolymerizable flexographic printing elements comprising a photopolymerizable elastomeric layer applied to a suitable substrate are used as starting materials. The substrate can be a polymer or metal film or can be cylindrical sleeves, for example sleeves made of polymeric materials or metals. Cylindrical sleeves to which a photopolymerizable layer or a printing layer is applied are called "sleeves".

In a first step, the photopolymerizable layer is exposed to actinic light through a suitable mask to form an image according to the desired print design. The mask has areas that are impermeable to actinic light and areas that are permeable to actinic light. When the photopolymerizable layer is exposed, it polymerizes in the exposed areas, whereas it does not polymerize in the unexposed areas. The mask can be a photographic negative, for example, which is placed onto the photopolymerizable layer or a digitally imagable layer that is applied to the photopolymerizable layer, for example a laser-ablatable opaque layer into which a mask is written using a laser. Also, the digitally imagable layer can be a layer brought out on the photopolymerizable layer, the applied layer capable of being made opaque to UV light imaging, for example a layer written by an Inkjet printer or a radiation-sensitive layer that can be blackened in certain areas using a radiation source.

After imaging exposure, the unexposed areas of the layer are removed using a suitable solvent and the printing form is dried to remove residual solvent. Then, a post-treatment can follow, for example exposure with UV-A and/or UV-C light. Each of the steps outlined is carried out in suitable processing equipment. In order to guarantee as rapid and economical a production of printing forms as possible, there are known processing devices in which two or more of the processing steps mentioned can be automatically carried out in succession.

The disadvantage to the known processing devices is the comparatively high space requirements. They can typically be 8 to 13 m long. Further, for economic reasons, there continues to be a need to shorten processing times as much as possible.

U.S. Pat. No. 5,919,378 discloses a device for producing round printing forms. Here, sleeves exposed for imaging are placed in a supply magazine and forwarded to a clean-out device through a solvent vapor safety lock. From there, the sleeves can be transferred to a drying unit and optionally to a post-treatment unit for exposure with UV-C light using an inspection unit to which sleeves can be withdrawn for testing purposes, and finally transferred to an output magazine.

U.S. Pat. No. 5,919,378 further discloses a method for producing round printing forms, the method comprising the following processing steps—in the sequence given: Suction of solvent vapors, cleaning out, drying and post-treatment with UVA and UVC radiation, wherein the round printing form is transported between each of the steps. The space requirements for this device and the method given is also relatively high due to the presence of a separate solvent vapor safety lock and due to the suction of solvent vapors taking place prior to the actual clean out step. In addition, due to the relatively large length of the process with the presence of a solvent vapor safety lock, the process time for producing a ready-to-print sleeve is lengthened, reducing production capacity.

The object of the invention is therefore to provide a device for producing sleeves which is of compact a design as possible and which facilitates a rapid and reliable production of sleeves.

Accordingly, a device for producing flexographic printing sleeves is provided which comprises at least
- (II) a clean-out unit for removing unexposed portions of image-exposed sleeves using cleaning agent,
- (III) a drying unit for removing residual cleaning agent from the cleaned out sleeves, and
- (IV) a post-exposure unit for re-exposing the sleeves with UV radiation, and wherein units (II), (III) and (IV) are arranged directly one after the other in the sequence given, the sleeves have length L and for the purposes of processing in the device are mounted concentrically on axles of length l by way of suitable support devices so that the sleeves can rotate during the processing, with the condition that $l > L$, and wherein furthermore each of units (II) and (IV) comprises a transport device (T) for transporting the sleeves into the unit and from there to the next respective unit or out of the device, and wherein the transport device (T) comprises two supports (H) for holding the axles of the sleeves mounted thereon, said axles extending out from both sides of the sleeves and said supports being disposed parallel to one another at a distance A, wherein for A, the following relationship holds; $L < A \leq l$, and
wherein the supports (H) are mounted dually translationally in the longitudinal direction of the device.

In a preferred embodiment of the invention, each of the transport devices (T) comprises two transport arms disposed parallel to one another, wherein the transport arms are mounted in such a way that they can move in the longitudinal direction, and a support (H) is disposed on each of the transport arms, the supports able to move along the transport arms.

Furthermore, a method for producing flexographic printing sleeves using such an apparatus was found.

DESCRIPTION

Figure 1:
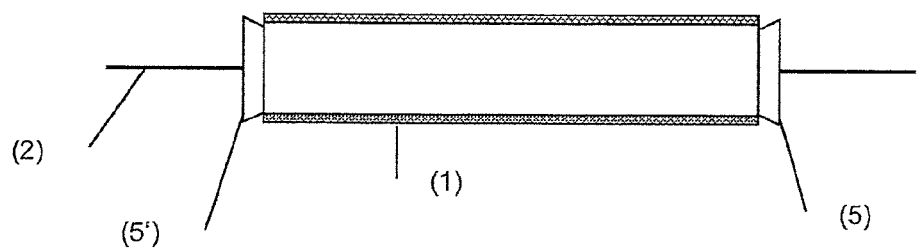
FIG. 1: Schematic representation of the installation of a sleeve on an axle

The following individual instructions are to be followed regarding the invention:

Sleeves Used

The term "flexographic printing sleeve" in the spirit of this invention means a ready-to-print round printing form wherein an elastomeric relief layer is applied to a cylindrical sleeve.

The term "photopolymerizable sleeve" means the starting material used for producing flexographic printing sleeves, namely a dimensionally stable cylindrical sleeve onto which a photopolymerizable layer is applied. Sleeves in this sense can be those that are completely covered with a photopolymerizable layer, or so-called continuous-seamless sleeves, or sleeves onto which photopolymerizable flexographic printing plates are applied in a suitable manner (the so-called plate-on-sleeve technology), for example using an adhesive layer such as for example double-sided adhesive tape or a connecting strip.

Sleeves commonly used as flexographic printing sleeves are cylindrical hollow parts of varying designs and varying composition, wherein the design and composition is selected by one trained in the art according to the printing requirements. For example, the sleeves can be metallic, polymeric or fiber-reinforced polymer cylindrical hollow parts, but can also be more complex hollow parts made up of multiple layers such as a relatively hard, resistant upper layer, a compressible intermediate layer and a hard, dimensionally stable inner layer. Moreover, in relatively light, axially deformable sleeves of minimal wall thickness, such as in so-called thin sleeves, an additional adapter sleeve can be used to increase the stability during processing; the actual support sleeve is reversibly pulled onto this adapter sleeve for the duration of the processing.

The photopolymerizable layer can include layers of any arbitrary photopolymerizable compositions suitable for the production of flexographic printing forms. The photopolymerizable layers generally comprise elastomeric binders, for example styrene-butadiene or styrene-isoprene block copolymers, ethylenically unsaturated monomers, photoinitiators and optionally other aids such as plasticizers, dyes or stabilizers. Suitable compositions of photopolymerizable layers for the production of flexographic printing forms are known to those trained in the art, who will make a suitable selection according to the desired properties of the flexographic printing form. For example, the hardness of the relief layer can be determined by the composition. Photopolymerizable sleeves can comprise further layers thereon, for example a second photopolymerizable layer of another composition (a so-called top layer), detaching layers on the photopolymerizable layer, frequently called a "substrate layer", or digitally imagable layers such as laser-abatable layers.

Mounting the Sleeves

Sleeves of different lengths and different diameters can be processed using the apparatus according to the invention. For processing in the apparatus, the sleeves are fastened to axles using suitable support elements. The axles are rotatably mounted in the apparatus in suitable support devices, thereby enabling the sleeves to be held in the apparatus rotating during processing. In the process, the axles always have the same length l independent of the length of the sleeves, wherein the length of the sleeves L naturally has to be less than the length of the axles, i.e. L<l. The position of the support elements on the axle can be changed so that sleeves of different lengths can also be processed with the device.

Support elements for holding the sleeves on the axles are basically known to persons trained in the art. For example, each of the two support elements can have approximately the shape of a truncated cone or a cylindrical disc. The sleeve can be clamped onto the axle using the support elements. Such truncated cones or discs can even be used to fasten sleeves with different diameters to the axles. FIG. 1 shows an example of a possible embodiment of the invention in which a sleeve (1) is mounted onto an axle (2) by way of two support elements (5), (5'). The axle extends out from both sides of the sleeve so that the sleeve can be placed into the carriage of the transport device (T) with the protruding sections of the axle. The length l depends on the design width of the device and can be from 2000 mm to 2500 mm, for example. In general, the axles should protrude in each case by at least 50 mm, preferably at least 100 mm out from the sleeve on both sides of the sleeve. For example, they can protrude 100 mm to 300 mm, preferably 150 mm to 250 mm and for example about 200 mm.

Device According to the Invention

Figure 6:
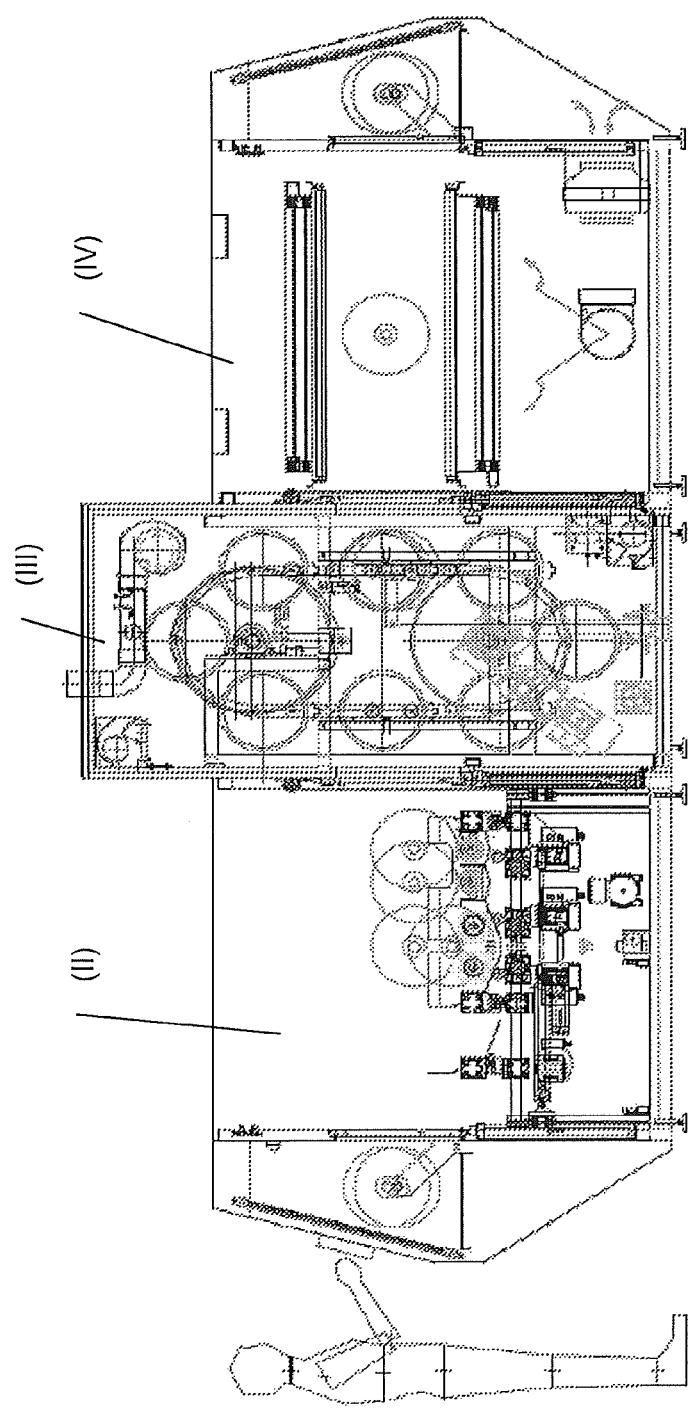
FIG. 6: Exemplary representation of an embodiment of the device according to the invention comprising a clean-out unit (II), a drying unit (III) and a post-exposure unit (IV)

The device according to the invention comprises at least a clean-out unit (II), a drying unit (III) and a post-exposure unit (IV), arranged one after the other in this sequence. In this case, the imaging exposure of the photopolymerizable sleeves is done in a separate apparatus and the processing of the sleeves in the device according to the invention begins with sleeves that have already been exposed for imaging. FIG. 6 shows an example of a device with units (II), (III) and (IV).

Figure 7:
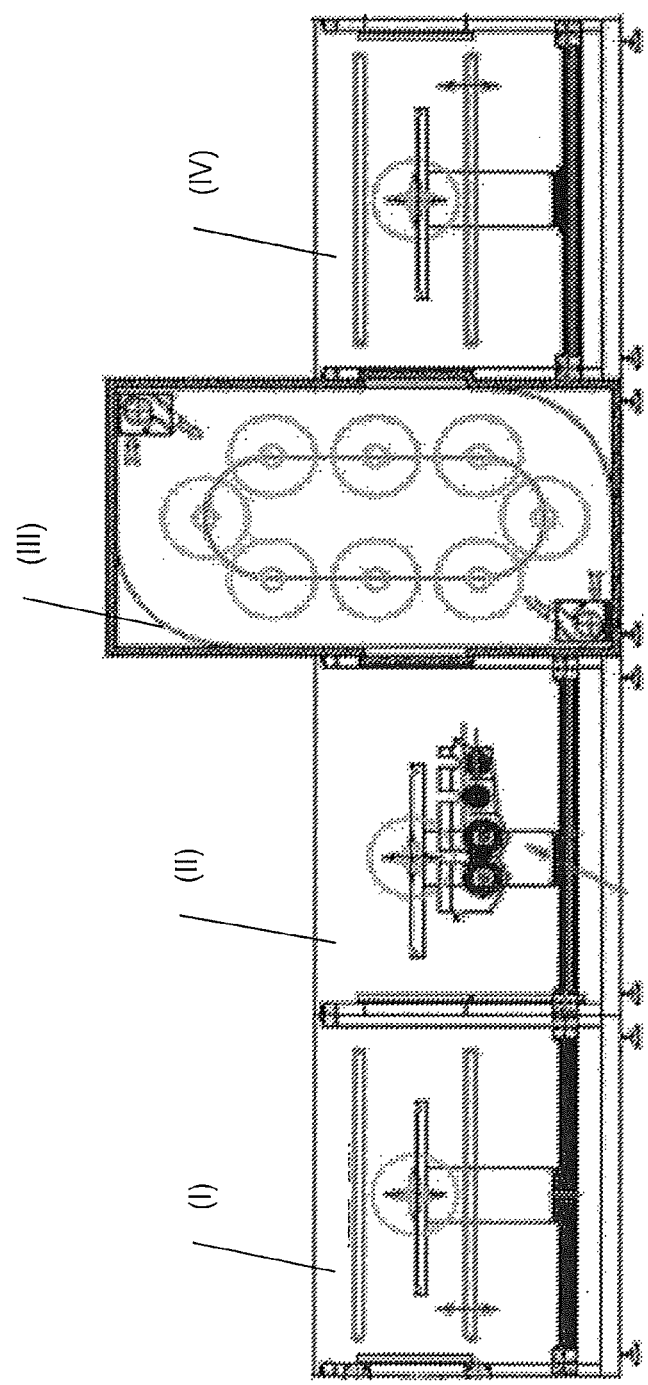
FIG. 7: Exemplary representation of an embodiment of the device according to the invention comprising an exposure unit (I), a clean-out unit (II), a drying unit (III) and a post-exposure unit (IV)

The device can optionally also comprise a main exposure unit (I) before the clean-out unit (II). In this case, the imaging exposure of the photopolymerizable sleeves is also carried out in the apparatus according to the invention. FIG. 7 shows an example of a device with units (I), (II), (III) and (IV).

As an option, of course, the device can comprise even more units, such as a storage magazine for providing photopolymerizable sleeves or a storage magazine for receiving finished sleeves.

Between the individual units, there are doors that are opened and closed for exchanging sleeves between the individual units. In particular, opening and closing can occur vertically, for example using a chain drive.

Transport Device

Units (II) and (IV) and—if present—unit (I) each comprise a transport device (T) according to the invention.

The sleeves can be transported into the unit and from there out to the next unit, respectively, or out of the device using the transport devices. For the first unit, i.e. depending on the embodiment of the invention either the clean-out unit (II) or the exposure unit (I), the sleeves are transported by the transport unit (T) from outside into the device according to the invention and from there are forwarded to the next unit. The sleeves are discharged from the device again from the last unit of the device as seen in the processing direction, the post-exposure unit (IV).

According to the invention, the transport device (T) comprises two supports (H) for holding the axles of the sleeves mounted thereon, said axles extending out from both sides of the sleeves and said supports being disposed parallel to one another, wherein the supports (H) are at a distance A from one another and wherein the relationship L<A≤l applies to the distance. Here, as defined above, L stands for the length of the sleeve and l is the length of the axle on which the sleeve is mounted. In other words, the sleeve is located in the space between the two supports (H).

The axles of the sleeves are rotatably mounted in the supports (H). The axles are preferred to be held near the ends thereof, and very preferred by means of a U-shaped bearing of the support (H) engaging in a matching concentric recess of the transport axle near the ends of the axle. "Near" the ends is intended to mean that the axles in general are held within a section of not more than 100 mm, preferably not more than 50 mm as seen from the ends of the axle. However, it is conceivable to have longer distances from the ends as well, but too long of a protrusion of the axles beyond the supports (H) should be avoided.

Figure 2:
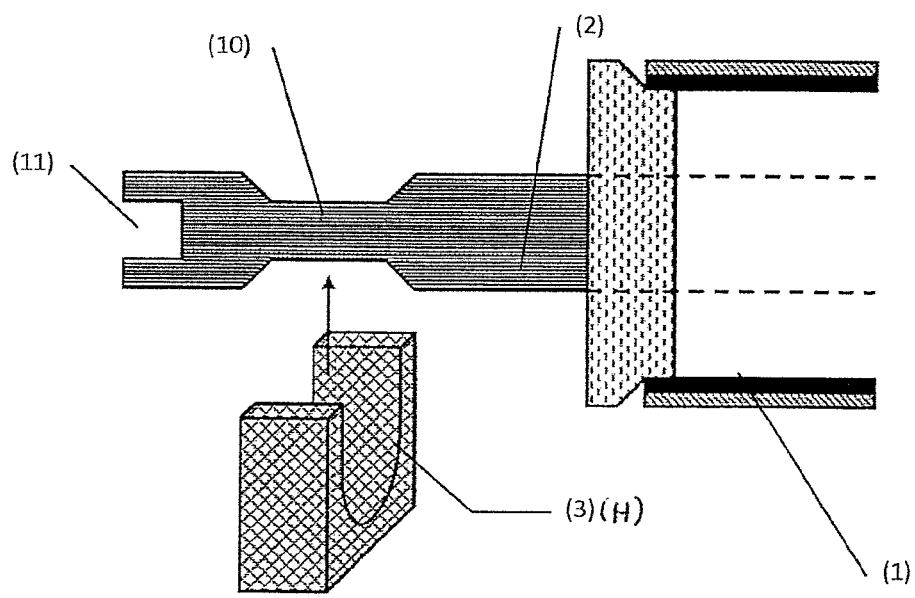
FIG. 2: Schematic representation of the mounting of a sleeve in the movable support (H)

FIG. 2 shows schematically an end of a sleeve (1) fastened to an axle (2). Near the end of the axle is a milled concentric recess (10) for inserting the axle into the support (H). The axle can have an additional notch (11) at the end, as shown in the figure, which can be used to couple a drive unit for rotating the axle.

According to the invention, the two supports (H) are dually translationally mounted in the longitudinal direction of the device, i.e. in the processing direction. The supports (H) are thus mounted such that they can be moved in the longitudinal direction of the device, thereby facilitating the transport of the sleeves within the device. The term "dually translational" means that first of all the supports (H) are movably mounted translationally using any suitable device, in other words they are mounted so that they can move in the longitudinal direction, and that furthermore the device itself is in turn translationally mounted. Through this dually translational mounting, a transport device (T) can be designed very compact.

In a preferred embodiment of the invention, each transport device (T) comprises two transport arms (4), (4') disposed parallel to one another.

Each of the transport arms is mounted such that it can move in the longitudinal direction. To this end, they are movably mounted in suitable bearings, for example using suitable rolling bearings. The mounting can be done along the full length of the transport arm, or only at points, in general at least at two points. For example, the movement in the longitudinal direction can be done using a toothed track attached to the transport arms, the toothed track allowing the transport arm to move in both directions along the longitudinal axle by way of a gear drive.

One of the supports (H) is attached on or at each of the two transport arms, and in such a way that the supports (H) can move along the transport arms. In this preferred embodiment, the dually translational mounting of the support (H) is achieved through the combination of a movable transport arm and the likewise movable support (H). A very compact design of the device is made possible in this way.

Figure 3:
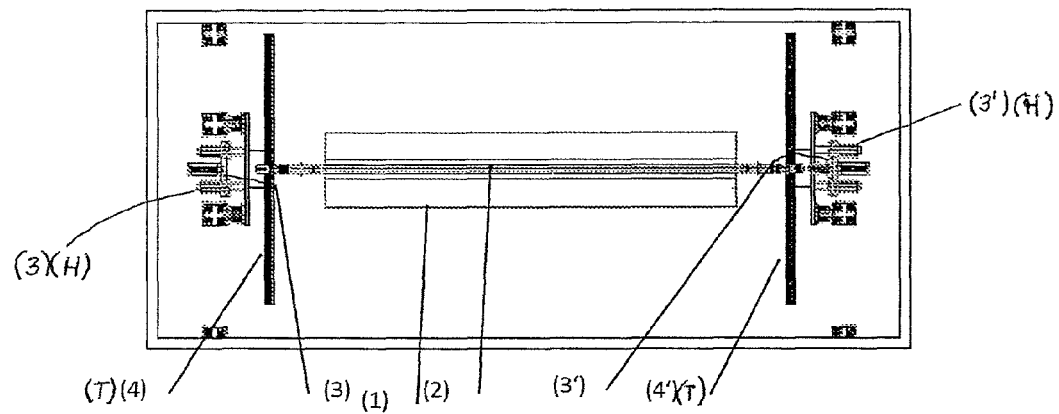
FIG. 3: View from above of a sleeve mounted on the transport device

FIG. 3 shows a schematic representation of a sleeve mounted on the transport device. The sleeve (1) is mounted on an axle (2), the ends of which are mounted in two carriages (3) or (3'), respectively, of support elements (5), (5') which in turn are mounted on two transport arms (4) or (4'), respectively.

In a preferred embodiment of the invention, the transport device (T) is also movably mounted in the vertical direction so that it can move up and down.

The carriages can firstly be moved to the end of the transport arm to accept a sleeve. Then, a small shift of the transport arm in the same direction is all that is needed to extend the ends of the transport arms and the carriages out of the apparatus and to place a sleeve onto the carriages.

Figure 4:
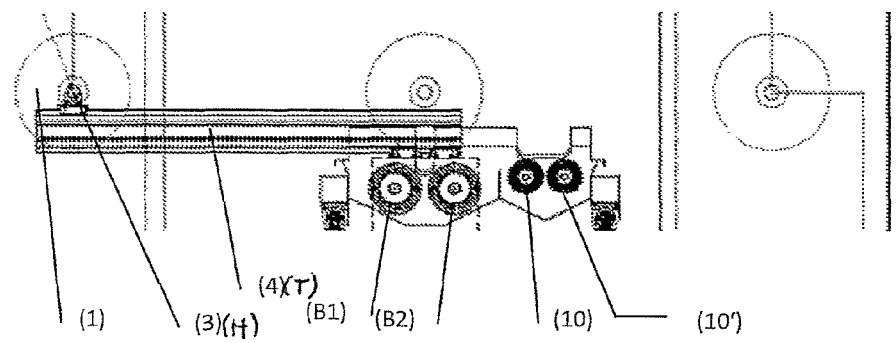
FIG. 4: Schematic representation of the transport of a sleeve using the transport device according to the invention, acceptance of a sleeve
Figure 5:
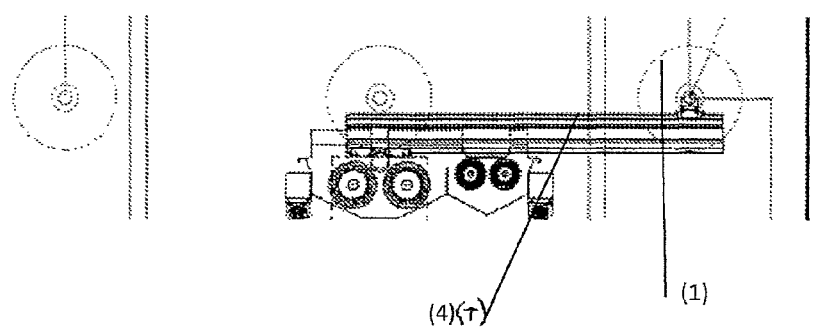
FIG. 5: Schematic representation of the transport of a sleeve using the transport device according to the invention, forwarding of a sleeve

FIG. 4 and FIG. 5 show an example of the functional principle of the transport device (T) when transporting a sleeve, the example involving transport into the clean-out unit (II) and then on to the drying unit (III). To accept a sleeve (1), the track (4) moves outward to the left—in the perspective of the drawing—and the carriage is also moved to the left end of the track (FIG. 4). There, the sleeve mounted on axles can be placed in the carriage (3). From there, the sleeve can be moved to the clean-out device by shifting the carriage and the transport arms. The sleeve can be further transported to the drying unit by moving the track and the carriage with the sleeve placed thereon to the right—in the perspective of the drawing (FIG. 5).

Clean-Out Unit (II)

The clean-out unit can be a common clean-out unit—regardless of the transport unit (T) according to the invention—in which the unexposed and accordingly uncured portions of the photopolymerizable layer are removed using suitable cleaning agents.

The composition of the cleaning agent being used depends on the type of photopolymerizable layer. For example, the cleaning agent can be water, aqueous solvent mixtures or organic solvent mixtures, for example cleaning agent that comprise high-boiling-point hydrocarbon fractions.

To remove the unexposed portions, additional mechanical aids are commonly used, in particular one or more brushes in contact with the sleeve. The brushes can be rotating brushes and in general the sleeve rotates during the clean-out process. The sleeve can be made to rotate during the clean-out process by rotating the axle on which the sleeve is mounted using a suitable drive unit. The drive unit is connected to the axle in a suitable manner prior to cleaning out. For example, the drive unit can be disposed lateral to the position of the sleeve in the direction of the axle. After the clean-out position is reached, the axle is rotated by the drive unit using a suitable coupling.

The cleaning agent can be applied to the brush(es), for example, or the brushes can be dipped into the cleaning agent at least partially. Suitable clean-out units are in principle known to those trained in the art, for example from U.S. Pat. No. 5,919,378.

Preferred Clean-Out Unit (IIa)

Figure 8:
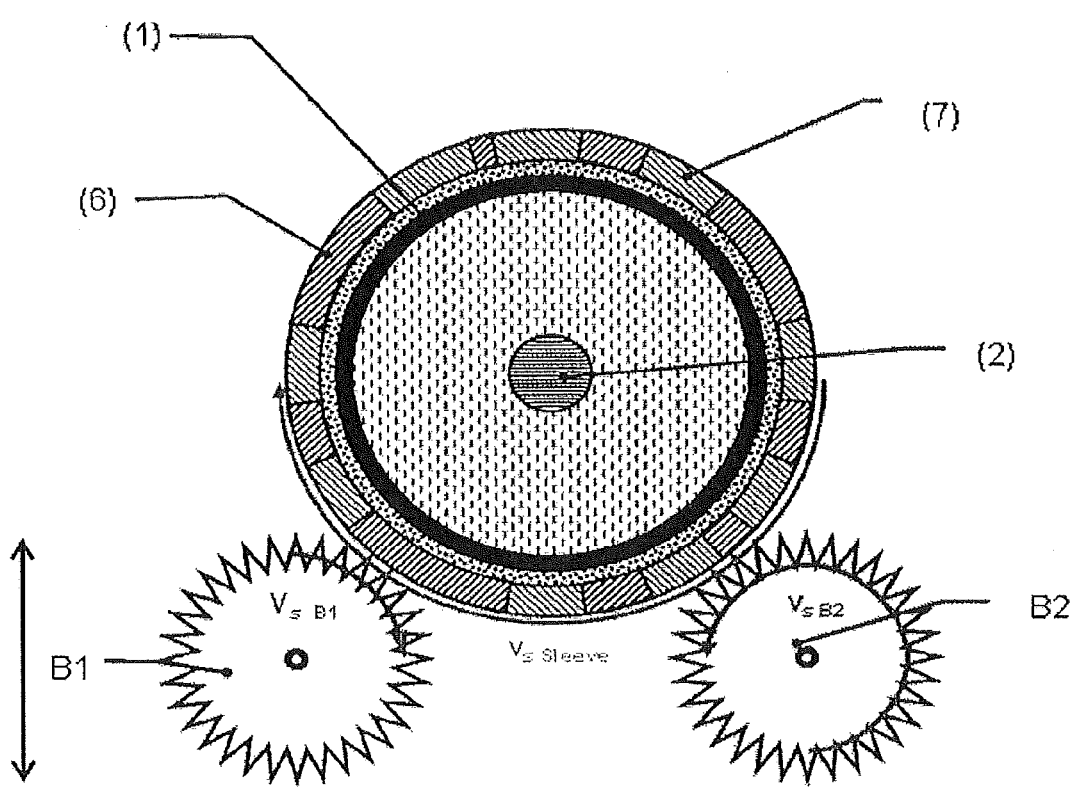
FIG. 8: Schematic representation of a preferred embodiment (IIa) of the clean-out unit

In a preferred embodiment of the invention, a clean-out unit (IIa) that comprises two rotating clean-out brushes can be used. FIG. 8 schematically shows the preferred embodiment of the clean-out unit. The brushes (B1) and (B2) are disposed in the clean-out unit (IIa) underneath the sleeve (1) and are vertically movable by way of a suitable device. The brushes do not touch the sleeve in the rest position. To perform the cleaning out, the sleeve, which in turn lies on the transport unit (T) with axle (2) (not shown in FIG. 8) in the manner described above, is moved to a position above the clean-out brushes. After reaching the clean-out position, the drive unit (not shown in FIG. 8) for the sleeve is connected to the axle. Then, the brushes are now moved from below toward the sleeve (1) to clean it out until they are in sufficient contact with the sleeve. At the end of the clean-out process, the brushes (B1) and (B2) can be moved back away from the sleeve downward. This movement of the brushes is indicated in FIG. 8 by way of the double arrow. The sleeve (1) has already been exposed for imaging and has cured, insoluble areas (6) and uncured areas (7) that are soluble in the cleaning agent. The distance of the two brushes from one another is usually constant. The clean-out unit also makes it possible to process sleeves of different diameters.

In the preferred clean-out unit (IIa), the sleeve and the brushes (B1) and (B2) each have separate drive devices for regulating the direction of rotation and the rotational velocity of the sleeve and of the two brushes separately of one another.

The sleeve is made to rotate for the purposes of clean-out. The two brushes (B1) and (B2) rotate in opposite directions from one another so that one of the two brushes has the same direction of rotation as the sleeve and the second brush rotates in the opposite direction. In the representation of FIG. 8, the sleeve rotates clockwise, brush (B1) also rotates clockwise and brush (B2) rotates counterclockwise. The direction of rotation is indicated in FIG. 8 through arrows, respectively.

With regard to surface movement (i.e. the motion of the web on the surface of the sleeve and the motion of the brushes B1 and B2) at the point of contact of the clean-out brushes (B1) and (B2), this means that the surface movements of the sleeve and of the brush (B1) rotating in the same direction are opposite to one another, whereas the surface movements of the sleeve and the brush (B2) rotating in the opposite direction have the same direction.

According to the invention, the brush (B2) rotating in the opposite direction to the sleeve rotates faster than the brush (B1) rotating in the same direction as the sleeve, the surface velocity of the brush (B1) $v_{B1}$ being smaller than the surface velocity of the sleeve $v_S$, and the surface velocity of the brush (B2) $v_{B2}$ being greater than the surface velocity of the sleeve $v_S$, in other words $|v_{B2}|>|v_S|>|v_{B1}|>0$.

What is particularly preferred is that the velocity of the brushes are adjusted such that the difference in surface velocities between the sleeve and B1 or B2 is about the same in each case, in other words $|v_S|-|v_{B1}|\approx|v_{B2}|-|v_S|$. The term "about the same" is intended to mean that the differences are the same within the usual technical range of variability. However, deviations should be at least $(\Delta v1^{OF}-\Delta v2^{OF})/(\Delta v1^{OF}+\Delta v2^{OF})<0.2$, preferably <0.1 and particularly preferably <0.05, wherein $\Delta v1^{OF}=|v_S|-|v_{B1}|$ and $\Delta v2^{OF}=|v_{B2}|-|v_S|$. The result of this velocity setting is that the surface of the sleeve is brushed once in the direction of rotation during clean-out and once in the direction opposite to the direction of rotation of the sleeve, wherein due to the constant velocity difference the mechanical load of the surface of the sleeve is even each time. This results in an especially good and simultaneously careful removal of the uncured portions of the layer.

The velocity difference can be set by one trained in the art depending on the nature of the photopolymerizable layer. It is preferable to be set to the same value even if the sleeves have different respective diameters. This keeps the mechanical load on the relief layer constant independent of the diameter of the sleeve, and as such the clean-out rate of the sleeve is also constant regardless of the diameter of the sleeve. This is a particular advantage of the preferred embodiment of the clean-out unit compared to a conventional clean-out unit with a constant rotational velocity of the brushes since in the latter the difference in surface velocity of course changes when the sleeve diameter changes, and as such the mechanical load changes.

A velocity difference of 1 to 50 m/min, preferably 5 to 40 m/min and more preferably 10 to 20 m/min has proven to be effective.

The cleaning agent can be applied directly to the brushes. In a preferred embodiment of the invention, the cleaning agent can be located in an open supply vessel, for example in a pan disposed beneath the brushes, wherein in each case the bottom side of the brushes dip into the cleaning agent. However, they should not dip in too far. Dipping the brushes at the bottom of the exterior brush surface 10 mm to 50 mm, preferably 10 mm to 30 mm deep into the solvent has proven to be effective.

Figure 9:
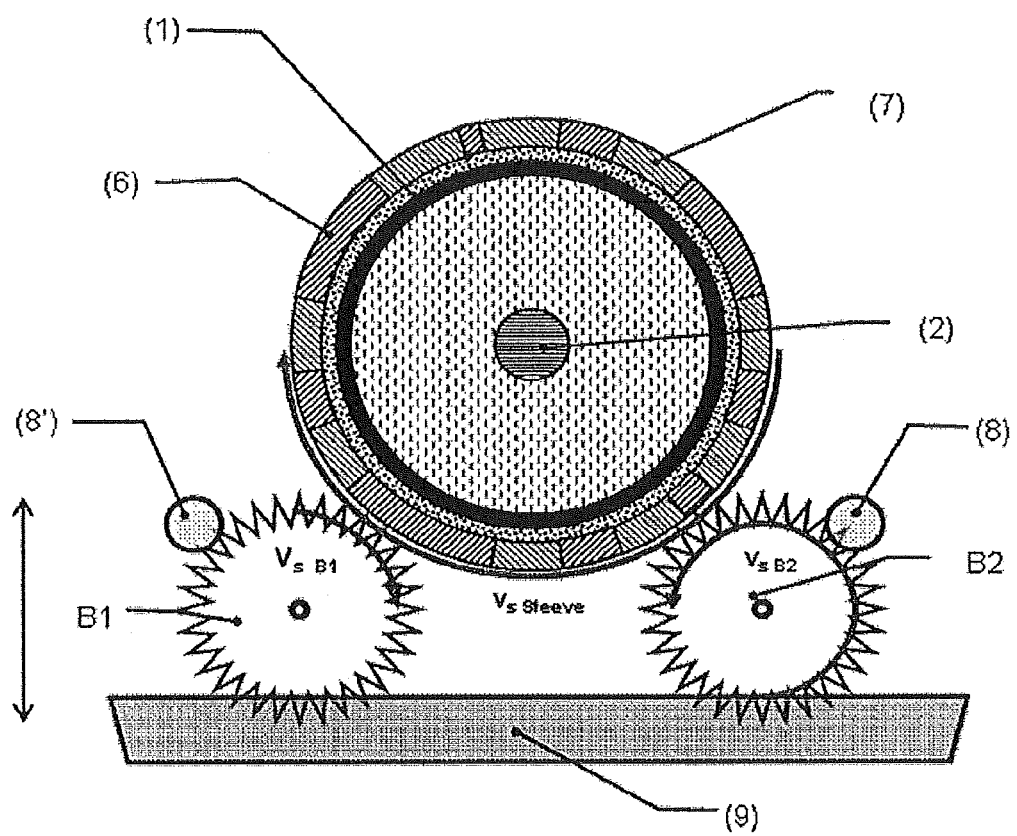
FIG. 9: Schematic representation of a preferred clean-out unit (IIa) with solvent application and doctor blades

Excess solvent on the brushes can be advantageously removed using a suitable doctor blade. Generally, the doctor blades should be disposed between the wetting of the brushes with the cleaning agent and the contacting of the brushes with the sleeve as seen in the direction of rotation. For example, they can advantageously be disposed at the 9 to 11 o'clock position or the 1 to 3 o'clock position. Such an embodiment is shown in FIG. 9 as an example, showing the brushes (B1) and (B2) that dip into a pan (9) containing the cleaning agent, and two doctor blades (8) and (8') for removing excess solvent. The doctor blades advantageously provide for the efficient removal from the brushes of cleaning agent that is contaminated with the cleaned out components of the photopolymerizable layer. In the preferred clean-out unit (IIa), it is not required that the clean-out brushes be dipped completely into the cleaning agent from time to time for cleaning purposes. Accordingly, the pan only has to hold a small amount of solvent supply.

In another preferred embodiment, the clean-out unit is equipped with a solvent circuit that comprises a measuring unit for monitoring the solids content in the solvent (i.e. the fraction of dissolved components of the photopolymerizable layer in the solvent). In the solvent circuit according to the invention, solvent is continuously withdrawn from the pan, the solvent returned continuously back to the pan after passing through the circuit. The circuit comprises a device for pumping the cleaning agent in a circuit, a discharge for used cleaning agent and a feed for fresh cleaning agent. Advantageously, the circuit further comprises a device for temperature control of the cleaning agent. This provides a particularly elegant and rapid tempering of the solvent. According to the invention, the circuit further comprises a continuous measuring unit for determining the solids content. Such measuring units are in principle known to those trained in the art. The solids content is continuously monitored this way. Fresh solvent is only metered in when the solids content in the cleaning agent exceeds a specific limit. In general, a cleaning agent load of up to 5 wt.-% solids is possible without any drop in quality. Metering is only required when this limit is exceeded. This causes the cleaning agent to be used very efficiently, and accordingly the amount of solvent necessary for cleaning out a sleeve is relatively low. Since, moreover, only a portion of the cleaning agent is located in the open pan and the rest of the cleaning agent is located in the closed circuit, the amount of exposed solvent vapors is also relatively low.

It is recommendable to pre-dry the sleeve prior to forwarding it to the drying unit (III). This helps to eliminate solvent droplets on the surface of the sleeve, which can lead to disruptions in the printed image after drying. The pre-drying can be done by rotating the sleeve after clean-out for a specific period of time without contact with the clean-out brushes, or by contacting the sleeve with one or more additional drying brushes.

In another preferred embodiment, the clean-out unit comprises two additional brushes (10) and (10') for carrying out a combined post-cleaning and pre-drying process. This is shown schematically in FIG. 4. The additional brushes are disposed downstream of the clean-out brushes in the direction of processing and can be run from below at the sleeve as in the clean-out brushes. Both brushes preferably comprise doctor blades disposed in similar positions as the clean-out brushes.

The sleeve is first transported to brushes (10) and (10') using the transport device for post-cleaning and pre-drying. Using the first of the two brushes, the sleeve, which has already been cleaned out, is firstly post-cleaned using a small amount of fresh cleaning agent. The second brush serves purely as a drying brush for removing solvent residue from the surface of the sleeve. Then, it is recommended that the sleeve be rotated again for a few minutes with no brush contact, for example for 1 to 3 min. This makes sure that there are no more solvent drops on the surface of the sleeve before the sleeve is moved to the drying unit.

The clean-out unit can also comprise a suction device for vapors from the cleaning agent.

Drying Unit (III)

The sleeve is conveyed from the clean-out unit (II) to the drying unit (III) using the transport device (T) of the clean-out unit.

The drying unit (III) can be a conventional drying unit in which the sleeves to be dried are moved around in a circle on a carousel. This is shown schematically in FIGS. 6 and 7. For example, it can be a drying unit similar to that disclosed in U.S. Pat. No. 5,919,378, in particular in column 3, lines 16 to 30. The sleeves are placed into the carousel in corresponding supports in the carousel circuit by means of the axles thereof. The drying unit in principle comprises a hot air fan and a suction device for the solvent vapors in a known fashion. The drying is usually done at 40° C. to 90° C., preferably 50° C. to 70° C.

In order to avoid thermal losses, in an advantageous embodiment of the invention, the air used for the drying can be entirely or partially circulated. The air circuit can in principle also comprise known heat exchangers and/or equipment for separating solvent vapor from the drying air stream.

Post-Exposure Unit (IV)

In the post-exposure unit, the sleeves are re-exposed to UV radiation, in particular UV-C radiation.

The post-exposure unit comprises a transport device (T) for transporting the sleeves from the drying unit to the post-exposure unit (IV) and—following the re-exposure—from the post-exposure unit (IV) out of the device according to the invention. The functionality of the transport device was already explained above.

The UV tubes needed for the re-exposure are preferred to be disposed above and below the sleeve and the sleeve rotates during the re-exposure.

Main Exposure Unit (I)

The device according to the invention can optionally also comprise a main exposure unit (I) before the clean-out unit (II). In this case, the imaging exposure of the photopolymerizable sleeves is also carried out in the apparatus according to the invention using actinic light.

According to the invention, the main exposure unit is also equipped with the transport device (T) according to the invention, the device able to transport the sleeves into the main exposure unit (I) and from there on to the clean-out device (II).

The radiation sources needed for the exposure can be any radiation sources that emit actinic light, in other words light that triggers curing in the photopolymerizable layer. In general, this is UV-A or UV-VIS radiation. This can in principle be generated by all radiation sources that emit UV light, for example from UV tubes. The light sources are preferred to be disposed above and below the sleeve, which rotates during the exposure.

In a preferred embodiment of the invention, the main exposure unit is able to expose two sleeves at once with actinic light.

Transport of the Sleeves Using the Transport Unit

Figure 10:
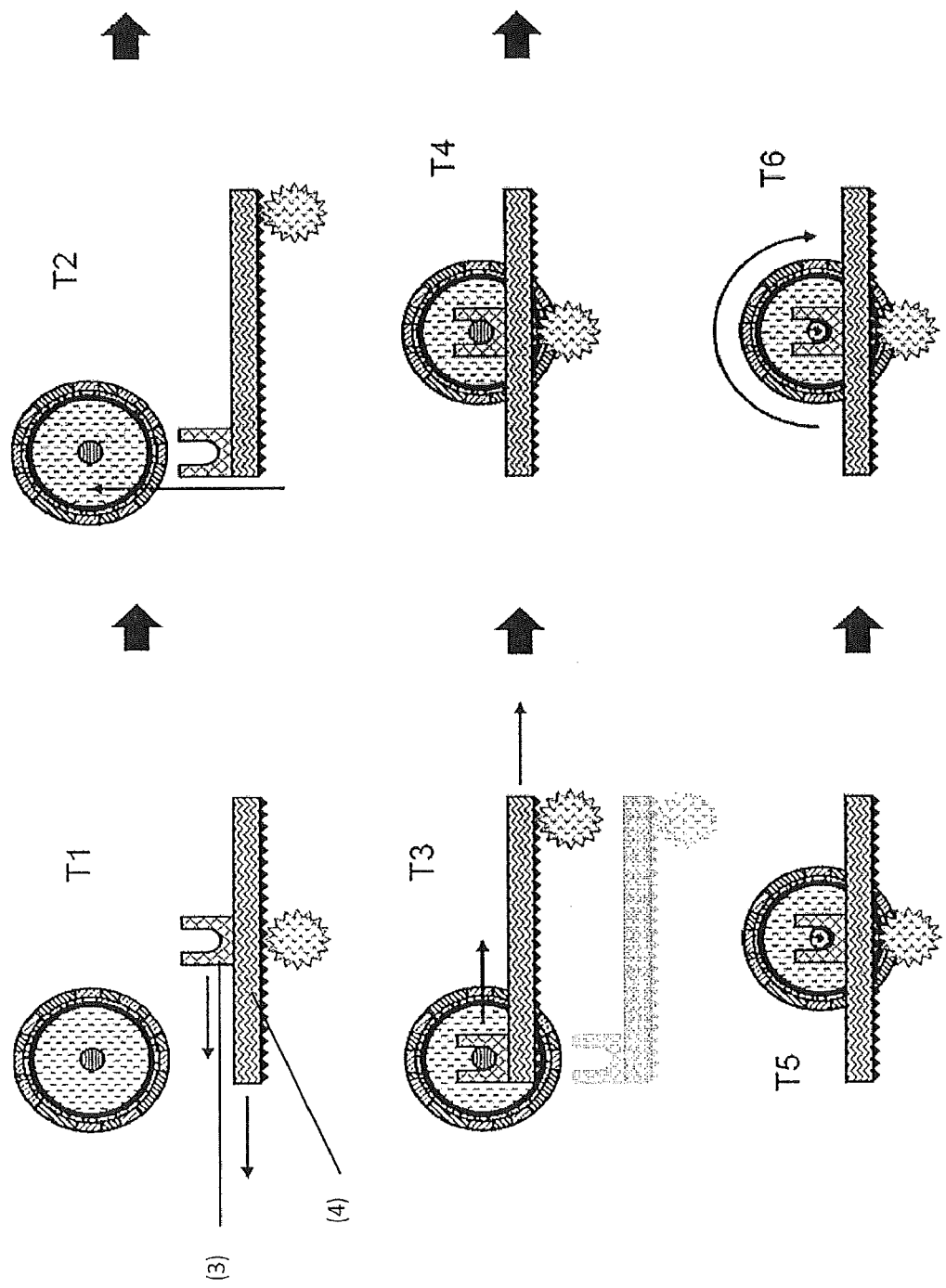
FIG. 10: Schematic representation of the sleeve transport from the sleeve input to the clean-out unit (II)
Figure 11:
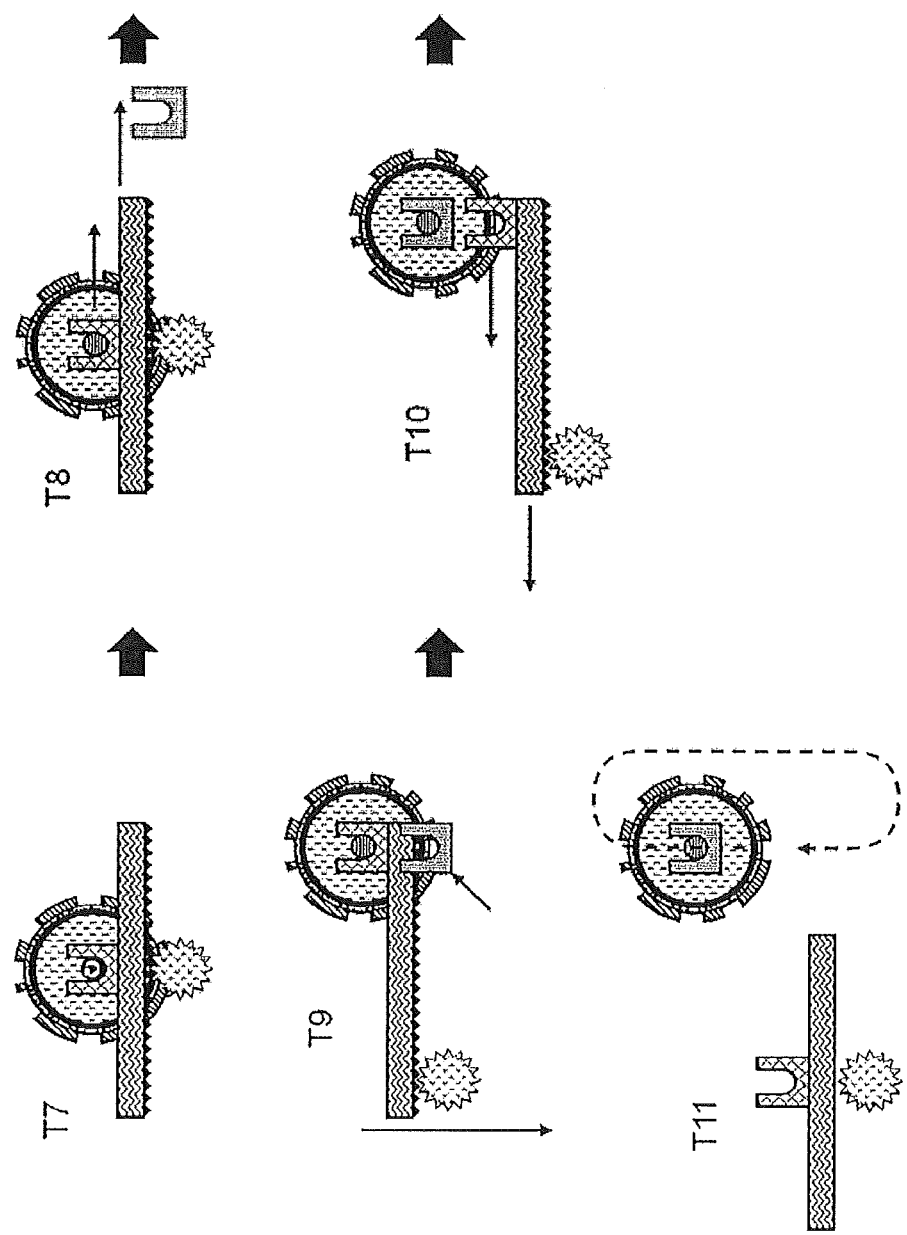
FIG. 11: Schematic representation of the sleeve transport from the clean-out unit (II) to the drying unit (III)

For purposes of illustration, an example of the transport of the sleeves using the preferred transport unit (IIa) into the clean-out unit (II) and from there on to the transport unit (III) is schematically shown again below in FIGS. 10 and 11 in individual views T1 to T11—this illustration does not exclude other ways of doing this.

To pick up a new sleeve, the support H (3) and the transport arm 4 move to the left out of the device (view T1). The sleeve is located in a on the axles thereof in a support outside the apparatus. The transport arm is moved upward vertically to accept the sleeve (T2). Now, the support and transport arm are moved back to the right into the clean-out apparatus (T3) to the required point (T4) where cleaning out is done with the brushes (not shown). Then, the drive for rotating the sleeve is first coupled to the sleeve axle (T5) and the clean-out process is performed while rotating the sleeve (T6). After the clean-out process ends (post-drying, if performed, is not shown) the axle of the sleeve is disconnected from the drive again (T7) and the support and the transport arm move further to the right to the drying unit (III) (T8). The carousel of the drying unit also comprises a U-shaped support for the sleeve, but at a different distance than the supports of the transport unit. By lowering the transport arms, the sleeve is now placed into the supports of the carousel of the dryer (T9) and the support H and the transport arm are retracted again (T10). The sleeve can now be dried in the drying unit (III) (T11).

Process

The device according to the invention can be used to produce ready-to-print sleeves fully automatically in a production line.

The method according to the invention comprises at least the following process steps (1) imaging exposure of the photopolymerizable layer using actinic radiation,
(2) removal of unexposed portions of the image-exposed sleeves using cleaning agent,
(3) drying the cleaned out sleeves, and
(4) post-exposure of the sleeves with UV radiation, wherein process steps (2), (3) and (4) are performed in the apparatus according to the invention, which comprises at least units (II), (III) and (IV). Step (1) can be carried out separately or if the device according to the invention also comprises a main exposure unit (I) can be carried out in the apparatus according to the invention as well. Details on carrying out the process steps have already been described above. Even if the exposure step (1) is done separately, the sleeves are preferred to be mounted on axles as described above so that they do not have to be re-mounted for processing in the apparatus according to the invention.

Advantages

The device according to the invention has a series of advantages.

Because of the transport device (T) and since there is no suction station before the clean-out unit, a very compact device design is possible. Devices with a length of only about 5 m can be built (without the main exposure unit), whereas devices currently on the market are longer. The device can therefore be set up in smaller spaces. Also, because of the compact design of the device according to the invention shortening of processing times while simultaneously reducing the susceptibility of transport disruptions is afforded thereby increasing the productivity in the processing of sleeves.

The preferred clean-out unit with a cleaning agent circuit and solids control allows a significant reduction in the amount of cleaning agent.

By keeping the velocity difference between the sleeve and the clean-out brushes constant by automatically adjusting the surface velocity of sleeves and clean-out brushes when the sleeve diameter changes, the required clean-out time is the same for all sleeve diameters. It is no longer necessary to re-adjust the clean-out time for each sleeve diameter.

The invention claimed is:

1. A device for producing flexographic printing sleeves comprising:
   a clean-out unit for removing unexposed portions of image-exposed sleeves using a cleaning agent,
   a drying unit for removing residual cleaning agent from the sleeves that had unexposed portions removed by the clean-out unit, and
   a post-exposure unit for re-exposing with UV radiation the sleeves that had residual cleaning agent removed by the drying unit,
   wherein the clean-out unit, the drying unit and the post exposure unit are arranged directly one after another in the sequence given, the sleeves have a length $L_S$ and for the purposes of processing in the device are mounted concentrically on axles of a length $L_A$ by way of suitable support devices so that the sleeves can rotate during processing in the device, wherein each of the clean-out unit and the post-exposure unit comprises a transport device for transporting the sleeves into each respective unit and from there to the drying unit or out of the device, characterized in that
   the transport device comprises two supports for holding the axles of the sleeves mounted thereon, said axles extending out from both sides of the sleeves and said supports being disposed parallel to one another at a distance A, wherein $L_S<A<L_A$, and the supports are mounted dually translationally in the longitudinal direction of the device.

2. The device as claimed in claim 1, characterized in that each of the transport devices comprises two transport arms disposed parallel to one another,
   the transport arms are mounted in such a way that the transport arms can move in the longitudinal direction, and
   a support of the two supports is disposed on each of the transport arms, the support able to move along the respective transport arm.

3. The device as claimed in claim 2, characterized in that the transport device is also movably mounted in the vertical direction.

4. The device as claimed in claim 2, characterized in that the transport arms can hold the axles near the ends thereof.

5. The device as claimed in claim 1, characterized in that the device also comprises an exposure unit disposed before the clean-out unit in which photopolymerizable sleeves can be image-exposed with actinic radiation, and wherein the exposure unit also comprises a transport device.

6. The device as claimed in claim 1, characterized in that the clean-out unit comprises two clean-out brushes that rotate in opposite directions and that are disposed below the sleeve, wherein the rotational velocities of the sleeve and of the two clean-out brushes can be regulated separately.

7. The device as claimed in claim 6, characterized in that the two clean-out brushes can be moved in the vertical direction by way of a suitable device, such that the two clean-out brushes can be moved from a rest position in which the two clean-out brushes make no contact with the sleeve to a working position in which the two clean-out brushes contact the sleeve.

8. The device as claimed in claim 6, characterized in that each of the two clean-out brushes is equipped with at least one doctor blade for removing excess cleaning agent and/or for removing contamination from the respective brush.

9. The device as claimed in claim 6, characterized in that a pan that is open upward is disposed below the two clean-out brushes, the pan holding the cleaning agent, wherein a bottom side of the two clean-out brushes dips into the cleaning agent.

10. A method for producing flexographic printing sleeves starting with photopolymerizable sleeves, comprising at least one cylindrical sleeve and a photopolymerizable layer applied thereto, the method comprising at least the processing steps of:
    (1) image-exposing of the photopolymerizable layer of the sleeves using actinic radiation,
    (2) removing unexposed portions of the image-exposed sleeves using cleaning agent,
    (3) drying the sleeves that had unexposed portions removed, and
    (4) post-exposing with UV radiation of the sleeves that were dried,
    characterized in that at least process steps of removing unexposed portions, drying and post-exposing are performed in a device as claimed in claim 1.

11. The method as claimed in claim 10, characterized in that the device also comprises an exposure unit disposed before the clean-out unit in which photopolymerizable sleeves can be image-exposed with actinic radiation, and wherein the exposure unit also comprises a transport device and that the processing step of image-exposing is also performed in the device.

12. The method as claimed in claim 10, characterized in that the device comprises a first clean-out brush and a second clean-out brush that rotate in opposite directions from one another, wherein the first clean-out brush rotates in the same direction as a rotational direction of the sleeve and the second clean-out brush rotates in the opposite direction to the rotational direction of the sleeve, and wherein $|V_{B2}|>|V_S|>|V_{B1}|$, where $|V_{B2}|$ is the magnitude of the surface velocity of the second clean-out brush, $|V_S|$ is the magnitude of the surface velocity of the sleeve and $|V_{B1}|$ is the magnitude of the surface velocity of the first clean-out brush.

13. The method as claimed in claim 12, characterized in that the rotational velocities of the brushes are adjusted such that $|V_{B2}|-|V_S|$ is approximately equal to $|V_S|-|V_{B1}|$.

* * * * *